United States Patent
Achtenberg et al.

(10) Patent No.: US 10,075,190 B2
(45) Date of Patent: Sep. 11, 2018

(54) ADAPTIVE SCHEDULER FOR DECODING

(71) Applicant: SANDISK TECHNOLOGIES LLC, Addison, TX (US)

(72) Inventors: Stella Achtenberg, Netanya (IL); Eran Sharon, Rishon Lezion (IL); Ran Zamir, Ramat Gan (IL)

(73) Assignee: SanDisk Technologies LLC, Addison, TX (US)

( * ) Notice: Subject to any disclaimer, the term of this patent is extended or adjusted under 35 U.S.C. 154(b) by 13 days.

(21) Appl. No.: 14/924,627

(22) Filed: Oct. 27, 2015

(65) Prior Publication Data

US 2017/0117925 A1    Apr. 27, 2017

(51) Int. Cl.
| | | |
|---|---|---|
| H03M 13/00 | (2006.01) | |
| H03M 13/37 | (2006.01) | |
| G06F 11/10 | (2006.01) | |
| G11C 29/52 | (2006.01) | |
| H03M 13/45 | (2006.01) | |
| H03M 13/11 | (2006.01) | |

(Continued)

(52) U.S. Cl.
CPC ..... *H03M 13/3746* (2013.01); *G06F 11/1072* (2013.01); *G11C 29/52* (2013.01); *H03M 13/114* (2013.01); *H03M 13/1108* (2013.01); *H03M 13/1137* (2013.01); *H03M 13/45* (2013.01); *G06F 11/10* (2013.01); *H03M 13/116* (2013.01); *H03M 13/1171* (2013.01); *H03M 13/1191* (2013.01); *H03M 13/152* (2013.01); *H03M 13/1515* (2013.01); *H03M 13/2957* (2013.01); *H03M 13/3707* (2013.01)

(58) Field of Classification Search
CPC ............. H03M 13/3746; H03M 13/45; H03M 13/1117; H03M 13/112; H03M 13/6583; H03M 13/6561; H03M 13/658; H03M 13/1122; H03M 13/114; H03M 13/1142; H03M 13/1114; H03M 13/116; H03M 13/1108; G06F 11/1072; G06F 11/1048; G06F 11/1012; G06F 13/1108; G11C 29/52

See application file for complete search history.

(56) References Cited

U.S. PATENT DOCUMENTS

| | | |
|---|---|---|
| 8,219,873 B1 | 7/2012 | Ng et al. |
| 8,504,890 B2 | 8/2013 | Sharon et al. |

(Continued)

FOREIGN PATENT DOCUMENTS

WO    WO 2015152922 A1 * 10/2015 .......... G06F 11/1012

OTHER PUBLICATIONS

Casado, et al., "Informed Dynamic Scheduling for Belief-Propagation Decoding of LDPC Codes", IEEE International Conference on Communications, Jun. 24-28, 2007, 932-937.

(Continued)

*Primary Examiner* — Guerrier Merant
(74) *Attorney, Agent, or Firm* — Michael Best & Friedrich LLP

(57) ABSTRACT

A decoder includes a processor and a scheduler coupled to the processor. The processor is configured to process a set of nodes related to a representation of a codeword during a first decode iteration. The nodes are processed in a first order. The scheduler is configured to generate a schedule that indicates a second order of the set of nodes. The second order is different from the first order.

27 Claims, 4 Drawing Sheets

(51) Int. Cl.
H03M 13/15 (2006.01)
H03M 13/29 (2006.01)

(56) References Cited

U.S. PATENT DOCUMENTS

| | | | |
|---|---|---|---|
| 8,560,919 | B2 | 10/2013 | D'Abreu et al. |
| 8,677,225 | B1 | 3/2014 | Weiner |
| 8,918,696 | B2* | 12/2014 | Ng ............... H03M 13/114 714/758 |
| 8,984,376 | B1* | 3/2015 | Norrie ............ H03M 13/114 714/772 |
| 2009/0063931 | A1* | 3/2009 | Rovini ............ H03M 13/114 714/758 |
| 2009/0132887 | A1* | 5/2009 | Matsumoto ...... H03M 13/1117 714/752 |
| 2009/0313525 | A1 | 12/2009 | Savin et al. |
| 2011/0246862 | A1 | 10/2011 | Graef |
| 2011/0252294 | A1* | 10/2011 | Ng ............... H03M 13/116 714/804 |
| 2013/0031440 | A1* | 1/2013 | Sharon ............ G06F 11/1012 714/758 |
| 2013/0139021 | A1* | 5/2013 | Hassan ............ G06F 11/1048 714/752 |
| 2013/0305114 | A1* | 11/2013 | Olcay ............ H03M 13/1108 714/755 |
| 2015/0180511 | A1 | 6/2015 | Ish-Shalom et al. |
| 2016/0087653 | A1* | 3/2016 | Yang ............... H03M 13/096 714/752 |

OTHER PUBLICATIONS

Radosavljevic, et al., "Optimized Message Passing Schedules for LDPC Decoding", Conference Record of the Thirty-Ninth Asilomar Conference on Signals, Systems and Computers, Oct. 28-Nov. 1, 2005, 591-595.

Sharon, et al., "An Efficient Message-Passing Schedule for LDPC Decoding", 23rd IEEE Convention of Electrical and Electronics Engineers in Israel, Sep. 6-7, 2004, 4 pages.

Sharon, et al., "Efficient Serial Message-Passing Schedules for LDPC Decoding", IEEE Transactions on Information Theory, vol. 53, No. 11, Nov. 2007, 4076-4091.

Maguolo, et al., "Analysis of Complexity for the Message Passing Algorithm," IEEE 16th International Conference on Software, Telecommunications and Computer Networks, Softcom 2008, Sep. 25, 2008, pp. 295-299.

Zimmerman et al., "Bit-Flipping Post-Processing for Forced Convergence Decoding of LDPC Codes," IEEE 13th European Signal Processing Conference, Sep. 4, 2005, pp. 1-4.

PCT Application No. PCT/US2016/051817, International Search Report and the Written Opinion of the International Searching Authority, dated Dec. 12, 2016, 17 pages.

\* cited by examiner

ADAPTIVE SCHEDULER FOR DECODING

FIELD OF THE DISCLOSURE

This disclosure is generally related to error correction coding (ECC) decoders.

BACKGROUND

Non-volatile storage devices, such as flash memory devices, have enabled increased portability of data and software applications. For example, flash memory devices can enhance data storage density by storing multiple bits in each cell of the flash memory. To illustrate, Multi-Level Cell (MLC) flash memory devices provide increased storage density by storing 3 bits per cell, 4 bits per cell, or more. Electronic devices, such as mobile phones, typically use non-volatile storage devices, such as flash memory devices, for persistent storage of information, such as data and program code that is used by the electronic device. Advances in technology have resulted in increased storage capacity of non-volatile storage devices with reductions in storage device size and cost.

To correct data errors, a flash memory device may utilize an error correcting code (ECC) technique. For example, the flash memory device may encode user data using an ECC technique to generate encoded data, such as an ECC codeword. The encoded data may be stored at the flash memory device and may be decoded by a decoder of the flash memory device, such as in response to a request for read access to the data from a host device that accesses the flash memory device.

The flash memory device may use a low-density parity check (LDPC) decoding technique to decode the data. The LDPC decoding technique may use a parity check matrix to decode an ECC codeword. An LDPC decoding operation may be performed (or represented) using variable nodes and check nodes. The variable nodes may represent bit values of the ECC codeword, and the check nodes may represent the parity equations of the parity check matrix. Each variable node may be "connected" to one or more of the check nodes. The connections between variable nodes and check nodes (or "constraints") may represent the set of parity equations specified by the parity check matrix. If bit values of decoded data satisfy the set of parity equations, then the decoded data is "correct" (e.g., has been successfully decoded).

A LDPC decoder typically processes variable nodes (and/or check nodes) according to a given schedule. For example, a serial V decoder may serially process variable nodes and a result of processing each node is used for updating one or more decoder parameters, such as log likelihood ratios (LLRs) associated with the variable nodes. In some implementations, the schedule may indicate an order in which each variable node is to be processed by the LDPC decoder during a decode iteration. The schedule used by the LDPC decoder is typically pre-computed and remains static during the decoding of a codeword. Processing of the variable nodes may continue until convergence (e.g., until all parity check equations are satisfied). A LDPC decoder's convergence rate may affect a data throughput, cost, and power consumption of the LDPC decoder.

DETAILED DESCRIPTION

Figure 1:
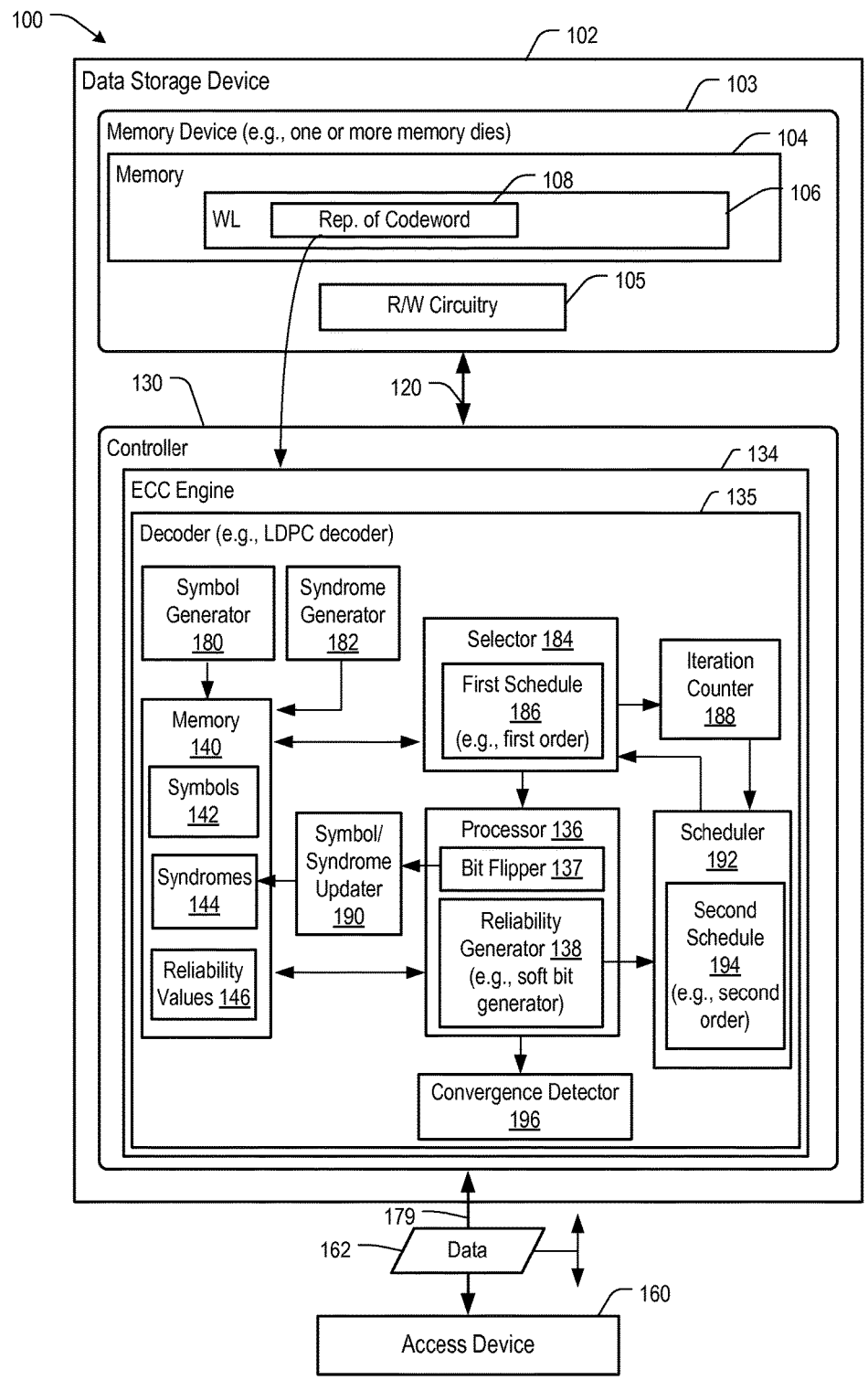
FIG. 1 is a block diagram of a particular illustrative example of a system including a data storage device that includes an ECC decoder and an adaptive scheduler.

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "examplary" may indicate an example, an implementation, and/or an aspect, and should not be construed as limiting or as indicating a preference or a preferred example, implementation, and/or aspect.

The present disclosure describes systems and methods of decoding using an adaptive schedule. To illustrate, an ECC decoder may process a set of nodes during a first decode iteration based on a first order (indicated by a first schedule). The set of nodes may include a set of variable nodes or a set of check nodes. The set of variable nodes may represent bit values of a codeword, and the check nodes may represent parity equations of a parity check matrix, as described herein. Each variable node may be "connected" to one or more of the check nodes and each variable node may participate in multiple parity check equations. Each parity check equation may correspond to a different check node of a set of check nodes. For example, a particular parity check equation may include an exclusive (XOR) operation of a first symbol (of a first variable node) and a second symbol (of a second variable node). Each parity check equation is evaluated based on values of the variable nodes that participate in the parity check equation to generate a result, referred to as a "syndrome." Accordingly, each of the syndromes may correspond to a different check node of the set of check nodes.

For each node processed during the first decode iteration, if a number of corresponding unsatisfied parity check equations is greater than or equal to a first threshold, a value of the node may be considered erroneous and may be changed. In some implementations, the set of nodes may include multiple groups of nodes and the ECC decoder may process the multiple groups of nodes based on the first order.

During the first decode iteration, the ECC decoder may generate at least a portion of a second schedule to be used during a second decode iteration. The second schedule may indicate a second order in which the set of nodes are to be processed during the second iteration. The second schedule may be generated using reliability information generated by the ECC decoder during the first decode iteration. For example, a particular node of the set of nodes may be scheduled based on a number of unsatisfied parity checks corresponding to the particular node during the first decode iteration. As another example, the particular node may be scheduled based on an LLR value corresponding to the particular node. In some implementations, the second order of the second schedule may cause nodes having a low reliability to be processed during the second decode iteration prior to nodes having a high reliability.

In some implementations, the ECC decoder may generate a first schedule to be used during the first iteration, such as an initial iteration. The first schedule may indicate a first order to process the set of nodes. The first order may be determined based on soft bit values corresponding to the set of nodes. The soft bit values may correspond to the set of nodes and may be received from a memory that stores a representation of a codeword. Based on the received soft bits, the ECC decoder may generate the first order of the first schedule to cause nodes having a low reliability (as determined based on the soft bits) to be processed during the first decode iteration prior to nodes having a high reliability (as determined based on the soft bits).

By dynamically scheduling processing of the set of nodes for a particular decode iteration (e.g., an initial decode iteration or a subsequent decode iteration) based on a reliablity value, a convergence rate of iterative decoding performed by the ECC decoder may be increased. For example, by generating a particular schedule to initially process one or more nodes that are "suspect" and likely to have a value that is erroneous, the ECC decoder may quickly correct a value(s) of the one or more nodes and may increase a convergence rate of the ECC decoder. By increasing the convergence rate, throughput of the ECC decoder may be increased and cost and power consumption may be decreased.

FIG. 1 depicts an illustrative example of a system 100 that includes a data storage device 102 and an access device 160. The data storage device 102 includes a controller 130 (e.g., a memory controller) and a memory device 103 that is coupled to the controller 130. The memory device 103 may include one or more memory dies.

The controller 130 includes a decoder 135, such as an error correction coding (ECC) decoder, that is configured, during decoding of a representation 108 of a codeword from a memory 104 of the memory device 103, to generate a schedule that indicates an order to process a set of nodes corresponding to the representation 108. The decoder 135 may determine the order based on one or more reliability values of the set of nodes. In some implementations, during a first decode iteration in which the decoder 135 processes the set of nodes based on a first order, the decoder 135 may generate at least a portion of a second schedule (that indicates a second order to process the set of nodes) to be used during a second decode iteration. The second order may be different from the first order. By dynamically scheduling processing of the set of nodes for a particular iteration, a convergence rate of decoding performed by the decoder 135 may be increased.

The data storage device 102 and the access device 160 may be coupled via a connection (e.g., a communication path 179), such as a bus or a wireless connection. The data storage device 102 may include a first interface (e.g., an access device interface) that enables communication via the communication path 179 between the data storage device 102 and the access device 160.

The access device 160 may include a memory interface (not shown) and may be configured to communicate with the data storage device 102 via the memory interface to read data from and write data to the memory device 103 of the data storage device 102. For example, the access device 160 may operate in compliance with a Joint Electron Devices Engineering Council (JEDEC) industry specification, such as a Universal Flash Storage (UFS) Access Controller Interface specification. As other examples, the access device 160 may operate in compliance with one or more other specifications, such as a Secure Digital (SD) Access Controller specification, as an illustrative, non-limiting example. The access device 160 may communicate with the memory device 103 in accordance with any other suitable communication protocol.

The access device 160 may include a processor and a memory. The memory may be configured to store data and/or instructions that may be executable by the processor. The memory may be a single memory or may include multiple memories, such as one or more non-volatile memories, one or more volatile memories, or a combination thereof. The access device 160 may issue one or more commands to the data storage device 102, such as one or more requests to erase data, to read data from, or to write data to the memory device 103 of the data storage device 102. For example, the access device 160 may be configured to provide data, such as data 162, to be stored at the memory device 103 or to request data to be read from the memory device 103.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks of storage elements (e.g., also referred to herein as memory cells). For example, each of the blocks may include a NAND flash erase block. Each storage element of the memory 104 may be programmable to a state (e.g., a threshold voltage in a flash configuration or a resistive state in a resistive memory configuration) that indicates one or more values. Each block of the memory 104 may include one or more word lines, such as a representative word line (WL) 106. Although the memory 104 is illustrated as including a single representative word line, in other implementations, the memory 104 may include any number of word lines. Each word line may include one or more pages, such as one or more physical pages. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write (R/W) circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies. In some implementations, the R/W circuitry 105 may be configured to generate a set of soft bits (e.g., a set of LLRs) based on a read operation. The set of soft bits may indicate a confidence (e.g., a reliability) of one or more bit values determined based on the read operation. Responsive to the read operation, the R/W circuitry 105 may provide the read data and the set of soft bits to the controller 130.

The memory device 103 may be coupled via a bus 120 to the controller 130. For example, the bus 120 may include one or more channels to enable the controller 130 to communicate with a single memory die of the memory device 103. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 160 and to send data to the access device 160. For example, the controller 130 may send data to the access device 160 via the communication path 179, and the controller 130 may receive data from the access device 160 via the communication path 179. The controller 130 is configured to send data and commands to the memory 104 and to receive data from the memory 104. For example, the controller 130 is configured to send data and a write command to cause the memory 104 to store data to an address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 includes an error correction code (ECC) engine 134. The ECC engine 134 may take the form of a packaged functional hardware unit designed for use with other components, a portion of a program code (e.g., software or firmware) executable by a (micro)processor or processing circuitry, or a self-contained hardware or software component that interfaces with a larger system, as illustrative, non-limiting examples.

The ECC engine 134 may include an encoder configured to encode one or more data words using an ECC encoding technique. For example, the ECC engine 134 may receive the data 162 and may generate a codeword. The ECC engine 134 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine 134 also includes the decoder 135. The decoder 135 is configured to decode data read from the memory 104 to detect and correct, up to an error correction capability of the ECC scheme, bit errors that may be present in the data. The decoder 135 may include a relatively low-power, high-speed decoder (e.g., a bit-flipping decoder). The ECC engine 134 may also include a full-power LDPC decoder (not shown) with a higher correction capacity than the decoder 135. The decoder 135 may include a serial V decoder, a serial C decoder, or both. For example, operations of the decoder 135 described herein may be performed by a serial V decoder or by a serial C decoder.

The decoder 135 includes a symbol generator 180, a syndrome generator 182, a memory 140, a selector 184, a symbol/syndrome updater 190, a processor 136, a scheduler 192, an iteration counter 188, and a convergence detector 196. The decoder 135 may be configured to perform an iterative low-power decoding operation on received data, such as the representation 108 of the codeword that is read from the memory 104. To illustrate, the representation 108 may match a valid codeword of an ECC scheme or may differ from the valid codeword due to one or more errors (e.g., due to data retention or disturb effects in the memory 104). The decoder 135 may map symbols 142 (e.g., bits) of the representation 108 to variable nodes of a bipartite graph, such as a Tanner graph, that corresponds to the ECC scheme and may selectively change the symbols 142 based on how many unsatisfied parity checks that each symbol participates in.

A decoding operation corresponding to the representation 108 may be performed (or represented) using variable nodes and check nodes, such as a set of variable nodes and a set of check nodes. The variable nodes may represent bit values of the codeword, and the check nodes may represent the parity equations of the parity check matrix. Each variable node may be connected to one or more of the check nodes. Each variable node may participate in multiple parity check equations. Bits of the codeword "participate" in parity check equations that are used to generate syndromes during decoding. For example, a parity check equation based on an exclusive-OR (XOR) of bits b1, b2, and b3 of a codeword may be represented as "b1 XOR b2 XOR b3=0". In this example, bits b1, b2 and b3 "participate" in the parity check equation. Each parity check equation may correspond to a different check node of a set of check nodes. Each parity check equation is evaluated based on values of the variable nodes that participate in the parity check equation to generate a result, referred to as a "syndrome." Accordingly, each of the syndromes may correspond to a different check node of the set of check nodes.

The decoder 135 may select a first variable node corresponding to a first symbol of a codeword to be decoded and may determine whether to change the symbol based on how many unsatisfied parity check equations the first symbol participates in. After determining whether to change the first symbol, the decoder 135 may update one or more syndromes that are affected by the change in the first symbol and continues with processing a next symbol of the codeword. Processing may continue until all parity checks have been satisfied (e.g., all syndromes are '0'), indicating a successful convergence to a valid codeword.

To illustrate, in a binary LDPC implementation, each symbol is a single bit and each syndrome is a single bit. A number of non-zero syndromes (e.g., representing unsatisfied parity check equations) associated with a symbol may be compared to a threshold, and if the number of non-zero syndromes equals or exceeds the threshold, the symbol bit may be changed (e.g., "flipped"). Although a binary LDPC implementation is described herein, in other implementations, the decoder 135 may be configured to perform low-power decoding of non-binary codewords (e.g., decoding multi-bit symbols based on multi-bit syndromes).

If all variable nodes are processed and one or more parity check equations remain unsatisfied (e.g., one or more syndrome is '1'), the decoder 135 may be configured to repeat processing of a set of variable nodes one or more times, up to a threshold number of decoding iterations. In case the decoder 135 has not converged within the threshold number of decoding iterations, the ECC engine 134 may initiate decoding using a higher-power decoder (e.g., a full-power LDPC decoder).

The symbol generator 180 may be configured to generate a set of symbols (e.g., symbols 142) based on the representation 108 of the codeword. For example, the symbol generator 180 may map symbols 142 (e.g., bits) of the representation 108 to variable nodes of a bipartite graph that corresponds to the ECC scheme. Each of the symbols 142 may correspond to a different variable node of a set of variable nodes. In some implementations, each symbol (e.g., each node) may have an index value that corresponds to an order, such as a sequential order, in which the symbol generator 180 processes bits of the representation 108. For example, a first symbol (e.g., a first variable node) may correspond to a first index value, a second symbol (e.g., a second variable node) may correspond to a second index value, etc.

The syndrome generator 182 may be configured to generate a plurality of syndromes (e.g., syndromes 144) based on the set of symbols. To illustrate, the syndrome generator 182 may generate syndromes 144 based on the symbols 142 (e.g., the set of variable nodes) and parity check equations. For example, a parity check equation may use multiple symbols as inputs and may output a syndrome value. Each of the syndromes 144 may correspond to a different check node of a set of check nodes.

The memory 140 may be coupled to the symbol generator 180 and to the syndrome generator 182. The memory 140 may be configured to store node values corresponding to the set of nodes, as described herein. For example, the memory 140 may store the set of symbols (e.g., the symbols 142) and the plurality of syndromes (e.g., the syndromes 144). In some implementations, the memory 140 may store the parity check equations. The symbols 142 may be received from the symbol generator 180 and the syndromes 144 may be received from the syndrome generator 182. Values of the symbols 142 and the syndromes 144 may be updated during or as a result of one or more decoding operations performed by the decoder 135, as described further herein.

In some implementations, the memory 140 may also store reliability values 146. The reliability values 146 may include soft bit values (e.g., LLRs) received from the memory device 103, soft bit values (LLRs) generated or updated during decoding operations performed by the decoder 135, the reliability values (e.g., a number of unsatisfied parity check equations for each variable node) generated during decoding operations performed by the decoder 135, or a combination thereof. In some implementations, the memory 140 may be configured to store at least one value for each node of the set of nodes. The at least one value may include a symbol value, a syndrome value, a reliability value, or a combination thereof, as illustrative, non-limiting examples. Additionally or alternatively, the memory 140 may include one or more thresholds (not shown) to be used by the processor 136, as described herein.

The selector 184 may be coupled to the memory 140 and to the processor 136. The selector 184 may include a first schedule 186 that indicates a first order of processing a set of nodes, such as the set of variable nodes, during a decode iteration of the decoder 135. The selector 184 may select values (e.g., one or more of the symbols 142 and/or one or more of the syndromes 144) from the memory 140 based on the first order indicated by the first schedule 186. For example, the selector 184 may select a particular node value (corresponding to a particular node of the set of nodes) based on the first order. To illustrate, the particular node value may include a symbol corresponding to the particular node, one or more syndromes that are determined based on the symbol, a reliability value corresponding to the particular node, or a combination thereof. The selector 184 may provide the particular node value to the processor 136.

The processor 136 may be coupled to the memory 140 and to the selector 184. The processor 136 may be configured to process one or more nodes of a set of nodes during a decode iteration. For each node processed based on a particular order (e.g., the first order), the processor 136 may determine whether to change a value of a symbol corresponding to the node and may output a reliability value corresponding to the node to the scheduler 192, as described herein.

During a particular decode iteration, the processor 136 may process the set of nodes based on an order indicated by a schedule. For example, during a first decode iteration, the processor 136 may process the set of nodes (e.g., the set of variable nodes) in a first order indicated by the first schedule 186. Further, during a second decode iteration, the processor 136 may process the set of nodes in a second order indicated by a second schedule 194. The first decode iteration may be performed prior to the second decode iteration. In some implementations, the first order and the second order are the same. In other implementations, the first order and the second order are different.

The processor 136 may include a bit flipper 137 and a reliability generator 138. For each node processed by the processor 136, the processor 136 may determine a number of unsatisfied parity checks for a particular node. The bit flipper 137 may compare the number of unsatisfied parity checks to a first threshold. In response to the number of unsatisfied parity checks being greater than or equal to the first threshold, the bit flipper 137 may initiate changing a value (e.g., a symbol) corresponding to the particular node. In some implementations, the processor 136 may change the value and store that changed value at the memory 140. In other implementations, the bit flipper 137 may provide a signal to the symbol/syndrome updater 190 to change the value corresponding to the particular node.

The reliability generator 138 (e.g., a soft bit generator) may determine (e.g., generate) a reliability value of the particular node. For example, the reliability value may indicate whether a value corresponding to the particular node is reliable or unreliable. The reliability generator 138 may determine the reliability value based on the number of unsatisfied parity checks, one or more soft bit values (e.g., one or more LLRs) corresponding to the particular node, whether the bit flipper 137 determined to change the value, or a combination thereof. To illustrate, the reliability generator 138 may determine the reliability value based on a comparison of the number of unsatisfied parity checks to a second threshold. If the number of unsatisfied parity checks is greater than or equal to the second threshold, the reliability value may indicate that the particular node (e.g., the value of the particular node) is unreliable. The second threshold may be less than the first threshold. As another example, the reliability generator 138 may indicate the particular node is unreliable if the number of unsatisfied parity checks is greater than or equal to the second threshold and less than the first threshold. As another example, the reliability generator 138 may determine the reliability value based on a cost function applied to one or more soft bit values (e.g., one or more LLRs) that correspond to the particular node. The reliability generator 138 may provide the reliability value to the scheduler 192, to the memory 140, or both.

The symbol/syndrome updater 190 may be configured to update one or more of the symbols 142, one or more of the syndromes 144, or a combination thereof in response to an output of the bit flipper 137. For example, in response to a signal to change a value of a symbol corresponding to a particular node (e.g., a particular variable node), the symbol/syndrome updater 190 may update (e.g., change) the value of the symbol and may update any syndromes that are affected by the change in the symbol. Syndromes to be updated may be altered at the memory 140 based on the updated value of the symbol. As another example, if the bit flipper 137 generates the updated value of the particular node, the symbol/syndrome updater 190 may update any syndromes that are affected by the change in the symbol.

The convergence detector 196 is coupled to the processor 136. The convergence detector 196 is configured to determine, if convergence has occurred after each node processed by the processor 136. For example, the convergence detector 196 may determine whether convergence as occurred after processing a sequentially first node in the first schedule 186. If the convergence detector 196 determines that convergence has occurred (e.g., indicating a successful convergence to a valid codeword), the decode iteration is terminated and the decoder 135 may output the symbols 142 as the decoded codeword. If convergence has not occurred, a sequentially next node in the first schedule 186 is processed. Thus, during each decode iteration, the convergence detector 196 may perform a separate convergence detection operation for each node that is processed during the iteration.

The scheduler 192 is coupled to the processor 136 and configured to generate an order of processing the set of nodes based on one or more reliability value. For example, the scheduler 192 may generate a second schedule 194 that indicates a second order. The second schedule 194 (e.g., the second order) may be used by the selector 184 and/or the processor 136 to process the set of nodes during a second decode iteration. In some implementations, the second order is different from the first order. In other implementations, the second order is the same as the first order.

The scheduler 192 is configured to generate the second order based on one or more reliability values received from the processor 136 (e.g., the reliability generator 138). For example, the scheduler 192 may determine a position of a particular node (of the set of nodes) in the second order based at least in part on the reliability value. To illustrate, the scheduler 192 may determine the second order such that nodes indicated as unreliable are prior to nodes indicated as reliable. An illustrative example of the scheduler 192 is described with reference to FIG. 2.

The iteration counter 188 may be configured to count a number of decode iterations (corresponding to the set of nodes) performed by the processor 136. The iteration counter 188 may set a count value to an initial value (e.g., zero) in response to an initial decode iteration associated with the set of nodes. The iteration counter 188 may increment the count value after an entirety of the set of nodes is processed by the processor 136. To illustrate, the iteration counter 188 may receive an indication that last node has been selected by the selector 184 based on the first schedule 186. In response to the indication, the iteration counter 188 may increment the count value and notify the scheduler 192 that the selector 184 has selected the last node. In response to the notification from the iteration counter 188, the scheduler 192 may provide the second schedule 194 to the selector 184 to be used during a next decode iteration.

In response to the iteration counter 188 incrementing the count value, the decoder 135 may compare the count value to a count threshold. If the count value is equal to the count threshold, the decoder 135 may stop processing the set of nodes and may indicate that the codeword (corresponding to the set of nodes) was not corrected.

During operation, the data storage device 102 may receive a read command from the access device 160. Responsive to the read command, the memory device 103 may perform a read operation to read the representation 108 of the codeword from the memory 104 (e.g., the non-volatile memory). The memory device 103 may provide the representation 108 to the controller 130.

The ECC engine 134 (e.g., the decoder 135) may receive the representation 108 and may generate a set of symbols (e.g., the symbols 142) based on the representation 108. Each symbol of the set of symbols may correspond to a different node of a set of nodes, such as a set of variable nodes. Additionally, the decoder 135 may generate a plurality of syndromes (e.g., the syndromes 144) based the set of symbols. To illustrate, bits of the representation 108 of the codeword may "participate" in parity check equations that are used to generate the syndromes during decoding. For example, a parity check equation based on an exclusive-OR (XOR) of bits b1, b2, and b3 of a codeword may be represented as "b1 XOR b2 XOR b3=0". In this example, b1, b2, and b3 "participate" in the parity check equation. Each syndrome of the plurality of syndromes may correspond to a different node of a set of check nodes. In some implementations, the ECC engine 134 (e.g., the decoder) may also receive or generate a set of log-likelihood ratios (LLRs) corresponding to the representation 108. Each LLR may correspond to different symbol (e.g., a different variable node).

The decoder 135 may initiate a first decode iteration to process a set of nodes (e.g., the set of variable nodes) based on a first order of (the first schedule 186). In some implementations, the first decode iteration is an initial decode iteration to decode the representation 108 of the codeword.

Processing the set of nodes in the first order may include selecting, based on the first order, a particular node of the set of nodes. The decoder 135 (e.g., the processor 136) may determine a number of satisfied parity checks associated with the particular node. The decoder 135 (e.g., the bit flipper 137) may determine whether to change a value of a particular symbol corresponding to the particular node based on a comparison of the number of satisfied parity checks to a first threshold. In some implementations, the decoder 135 (e.g., the reliability generator 138) may determine a reliability value corresponding to the particular node based on a second comparison of the number of satisfied parity checks to a second threshold. Additionally or alternatively, the decoder 135 (e.g., the reliability generator 138) may determine a reliability value corresponding to the particular node based on a second comparison of a log-likelihood ratio of the particular node to a third threshold. In some implementations, the decoder 135 (e.g., the reliability generator 138) may determine that a reliability value corresponding to the particular node is a low reliability value in response to determining to change the value of the particular symbol.

The scheduler 192 may generate the second schedule 194 that indicates a second order of the set of nodes. For example, the second order may indicate that one or more nodes of the set of nodes having a low reliability value are to be processed during a second decode iteration prior to processing, during the second decode iteration, one or more nodes of the set of nodes having a high reliability value.

After the particular node is processed by the processor 136, the convergence detector 196 is configured to determine if convergence has occurred. If convergence has occurred, the decoder 135 may output the symbols 142 as the decoded codeword. If convergence has not occurred, a next node of the set of nodes may be selected based on the first order. If all of the nodes of the set of nodes have been processed, the decoder 135 may begin a second decode iteration that uses the second schedule 194. To illustrate, processor 136 may process the set of nodes (e.g., the set of variable nodes) in the second order during the second decode iteration.

As an illustrative, non-limiting example, the decoder 135 may receive the representation 108 and may generate thirteen symbols that are mapped to a set of thirteen variable nodes index as v1-v13. The processor 136 may sequentially process the set of variable nodes (v1-v13) during a first decode iteration in a first order (of the first schedule 186) starting with v1 and ending with v13. During the first decode iteration, the processor 136 may determine that symbol values corresponding to variable nodes v5, v7, and v13 are unreliable. The scheduler 192 may generate the second schedule 194 having a second order. The second order may indicate that the unreliable variable nodes v5, v7, and v13 are to be processed during a second decode iteration prior to variable nodes v1-v4, v6, and v8-v12. During the second decode iteration, the processor 136 may begin processing the set of variables in the second order starting with variable nodes v5, v7, and v13. After processing the variable node v13, the decoder 135 may determine that convergence has occurred and may end the second decode iteration without processing the variable nodes v1-v4, v6, and v8-v12.

In some implementations, the ECC engine 134 may receive, from the memory device 103, a set of soft bits (e.g., that may be used to generate a set of log-likelihood ratios (LLRs)) corresponding to the representation 108. The symbol generator 180 may generate the symbols 142 using the bits of the representation 108 and may map the symbols to different variable nodes. For example, a first bit of the representation may be used as a first symbol that is mapped to a first variable node. Accordingly, an LLR of the first bit may be used as an LLR of the first symbol (e.g., the first variable node). The decoder 135 (e.g., the scheduler 192) may generate the first schedule 186 indicating the first order based on the set of soft bits (e.g., the set of LLRs) received from the memory 104. To illustrate, the scheduler 192 may determine the first order of the set of nodes (e.g., the set of variable nodes) based on the set of LLRs. The scheduler 192 may generate the first schedule 186 such that the first order indicates that variable nodes having a low reliability (as determined based on the set of soft bits) are processed during a first decode iteration prior to variable nodes having a high reliability. In some implementations, the first decode iteration is an initial decode iteration to decode the representation 108 of the codeword.

During the first decode operation, the second schedule 194 is generated for the second decode iteration, and during the second decode iteration, the scheduler 192 may generate a third schedule to be used during a third decode iteration that is subsequent to the second decode iteration. The third schedule may indicate a third order of the set of nodes to be used during the third decode iteration. The third order may be the same as or different from the first order. Additionally or alternatively, the third order may be the same as or different from the second order.

In some implementations, the set of nodes can include multiple groups of nodes. For example, if the set of nodes includes a set of variable nodes, the set of variable nodes can include a first group of variable nodes and a second group of variable nodes. As another example, if the set of nodes includes a set of check nodes, the set of check nodes can include a first group of check nodes and a second group of check nodes. When the set of nodes includes the multiple groups of nodes, the processor 136 may be configured to sequentially process groups of nodes based on the first order (which may indicate an order of processing the multiple groups of nodes). For example, the processor 136 may process the first group of variable nodes followed by the second group of variable nodes. To process a particular group of nodes, the processor 136 may process each node of the particular group of nodes in parallel.

To illustrate, decoder 135 may select a group of nodes (of the set of nodes) based on the first order. For each node included in the group of nodes, the processor 136 may determine a number of satisfied parity checks associated with the node. The processor 136 may identify a particular node of the group of nodes having a lowest number of satisfied parity checks. The processor 136 (e.g., the reliability generator 138) may determine a reliability value corresponding to the group of nodes based on a comparison of a number of satisfied parity checks of the particular node to a threshold. The reliability value of the group of nodes may be provided to the scheduler 192 and the scheduler 192 may determine a position of the group of nodes in the second order (of the second schedule 194) based at least in part on the reliability value.

In some implementations, the decoder 135 may generate an initial schedule, such as the first schedule 186, for an initial iteration. During processing the initial iteration according to the initial schedule, the decoder 135 may sort the set of nodes into multiple groups of nodes and generate a schedule (e.g., the second schedule 194) for a next iteration based on the groups of nodes. Each group of the multiple groups of nodes may correspond to a different reliability. For example, a first group of the multiple groups of nodes may include reliable nodes and a second group of the multiple groups of nodes may include unreliable nodes. The decoder 135 may order the set of nodes in the second schedule such that unreliable nodes are scheduled to be processed prior to reliable nodes. For example, during the next iteration, each node of the second group may be processed prior to one or more nodes of the first group. Although described as "groups of nodes", alternatively, the decoder 135 may group sets of nodes, e.g., corresponding to lifting factor groups.

If the multiple groups of nodes include more than two groups, each group may correspond to a different "degree"

of reliability. For example, the multiple groups of nodes may include the first group associated with reliable nodes, the second group associated with unreliable nodes, and a third group that includes nodes having a reliability that is determined to be between reliable and unreliable. The decoder 135 may order the set of nodes in the second schedule such that nodes of the third group are scheduled to be processed after the second group is processed and prior to the one or more nodes of the first group being processed.

In some implementations, the decoder 135 may perform multiple iterations to decode a representation of a codeword. The decoder 135 may be configured to generate a schedule (e.g., a new or updated schedule) for one or more of the multiple iterations. For example, the decoder 135 may generate the initial schedule prior to performing the initial iteration. As another example, a next schedule (e.g., the second schedule 194) may be generated at least in part during a current iteration that processes the set of nodes based on the first schedule 186. The next schedule (e.g., the second schedule 194) may be the same as the first schedule 186 or may be a different schedule. An order of the set of nodes corresponding to the next schedule may be determined "on-the-fly" (e.g., in parallel with the set of nodes being processed based on the first schedule 186). To illustrate, the next schedule may be generated during the same processing cycles (e.g., clock cycles) during which the set of nodes are processed based on the first schedule 186. Thus, generating the next schedule (e.g., the second schedule 194) may not use any additional processing cycles (e.g., clock cycles) beyond what is needed to process the set of nodes based on the first schedule 186.

In some implementations, a reliability (or degree of reliability) of each node may be determined using one or more metrics. For example, a first metric of a particular node may include a number of unsatisfied parity check equations that correspond to the particular node. A reliability of the particular node may be determined by comparing the number of unsatisfied parity check equations to a threshold. The threshold may vary from clock cycle to clock cycle, from node to node, or from decode iteration to decode iteration, as illustrative, non-limiting examples. In some implementations, a value of the threshold may depend on (e.g., change based on) whether the particular bit was previously identified as unreliable. A second metric of the particular node may include an indication of whether a bit value (e.g., a symbol value) of the particular node was flipped (e.g., changed) in a previous iteration, such as a most recent decode iteration or within the past two iterations. If the bit value of the particular node was flipped, the second metric may indicate that the particular node is unreliable. If the particular node is a variable node, a third metric of the particular node may include one or more LLR. Low LLR values may indicate that the particular node is unreliable. If the particular node is a check node, a fourth metric of the particular node may include a number of unreliable variable nodes connected to the particular check node. For example, the number of unreliable variable nodes may be quantified by using soft XOR on the incoming LLRs (corresponding to the variable nodes). The greater the number of unreliable variable nodes, the more unreliable the particular node may be determined to be. The one or more metrics described herein may be used individually or in combination to determine a reliability (or a degree of reliability) of one or more nodes of the set of nodes.

In a particular implementation of the system 100, the memory 104 (e.g., a non-volatile memory) may be configured to store the representation 108 of the codeword. The memory 104 (e.g., the non-volatile memory) may include the read/write circuitry 105 that is configured to receive a read request from the controller 130 and to perform a read operation to read the representation 108 of the codeword responsive to the read request. The controller 130 is coupled to the memory 104 (e.g., the non-volatile memory). During a first decode iteration, the decoder 135 of the ECC engine 134 is configured to process each node of a set of nodes in a first order. For example, the decoder 135 may sequentially process each individual node of the set of nodes according to the first order during the first decode iteration. The set of nodes may be associated with the representation. The decoder 135 may generate at least a portion of a schedule (e.g., the second schedule 194) during the first decode iteration. The schedule (e.g., the second schedule 194) may indicate the second order. The decoder 135 may be further configured to, during a second decode iteration, process at least one node of the set of nodes in a second order, the second order different from the first order. In some implementations, the at least one node may include at least one group of nodes (e.g., multiple nodes that are each processed in parallel).

In some implementations, the symbols 142, the syndromes 144, the reliability values 146, the first schedule 186, and/or the second schedule 194 may be stored at the memory 104. In other implementations, the controller 130 may include or may be coupled to a particular memory, such as a random access memory (RAM), that is configured to store the symbols 142, the syndromes 144, the reliability values 146, the first schedule 186, and/or the second schedule 194. In some implementations, the particular memory may include the memory 140. Alternatively, or in addition, the controller 130 may include or may be coupled to another memory (not shown), such as a non-volatile memory, a RAM, or a read only memory (ROM). The other memory may be configured to store the symbols 142, the syndromes 144, the reliability values 146, the first schedule 186, and/or the second schedule 194. The other memory may be a single memory component, multiple distinct memory components, and/or may include multiple different types (e.g., volatile memory and/or non-volatile) of memory components. In some implementations, the other memory may be included in the access device 160.

In some implementations, the data storage device 102 may be attached to or embedded within one or more access devices, such as within a housing of the access device 160. For example, the data storage device 102 may be embedded within the access device 160, such as in accordance with a Joint Electron Devices Engineering Council (JEDEC) Solid State Technology Association Universal Flash Storage (UFS) configuration. For example, the data storage device 102 may be configured to be coupled to the access device 160 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). To further illustrate, the data storage device 102 may be integrated within an apparatus (e.g., the access device 160 or another device), such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory.

In other implementations, the data storage device 102 may be implemented in a portable device configured to be selectively coupled to one or more external access devices. For example, the data storage device 102 may be removable from the access device 160 (i.e., "removably" coupled to the access device 160). As an example, the data storage device 102 may be removably coupled to the access device 160 in accordance with a removable universal serial bus (USB) configuration. In still other implementations, the data storage device 102 may be a component (e.g., a solid-state drive (SSD)) of a network accessible data storage system, such as an enterprise data system, a network-attached storage system, a cloud data storage system, etc.

In some implementations, the data storage device 102 may include or correspond to a solid state drive (SSD) which may be included in, or distinct from (and accessible to), the access device 160. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 160 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the access device 160 may be configured to communicate using one or more protocols, such as an eMMC protocol, a universal flash storage (UFS) protocol, a universal serial bus (USB) protocol, a serial advanced technology attachment (SATA) protocol, a peripheral component interconnect express (PCIe), a non-volatile memory express (NVMe), and/or another protocol, as illustrative, non-limiting examples.

Although one or more components of the data storage device 102 have been described with respect to the controller 130, in other implementations, certain components may be included in the memory device 103 (e.g., the memory 104). For example, the ECC engine 134 may be included in the memory device 103. Alternatively, or in addition, one or more functions as described above with reference to the controller 130 may be performed at or by the memory device 103. For example, one or more functions of the ECC engine 134 may be performed by components and/or circuitry included in the memory device 103.

Alternatively, or in addition, one or more components of the data storage device 102 may be included in the access device 160. For example, one or more components of the ECC engine 134 may be included in the access device 160. Alternatively, or in addition, one or more functions, as described above with reference to the controller 130, may be performed at or by the access device 160. As an illustrative, non-limiting example, the access device 160 may be configured to process a set of nodes based on a first order of the set of nodes during a first decode iteration. The access device 160 may be configured to generate a schedule (e.g., the second schedule 194) that indicates a second order of the set of nodes to be used during a second decode iteration. The second order may be different from the first order.

The example(s) described with reference to FIG. 1 enable dynamic scheduling of a set of nodes to be processed for a particular decode iteration (e.g., an initial decode iteration or a subsequent decode iteration) based on a reliablity value. By dynamically scheduling the set of nodes based on one or more reliability values, a convergence rate of iterative decoding performed by the decoder 135 may be increased. For example, by generating a particular schedule (e.g., the first schedule 186 or the second schedule 194) to process one or more nodes that are "suspect" and likely to have a value that is erroneous prior to processing nodes that are likely not erroneous, the decoder 135 may quickly correct a value(s) of the one or more nodes and may increase a convergence rate of the ECC decoder. By increasing the convergence rate, throughput of the decoder 135 may be increased and cost and power consumption may be decreased.

Figure 2:
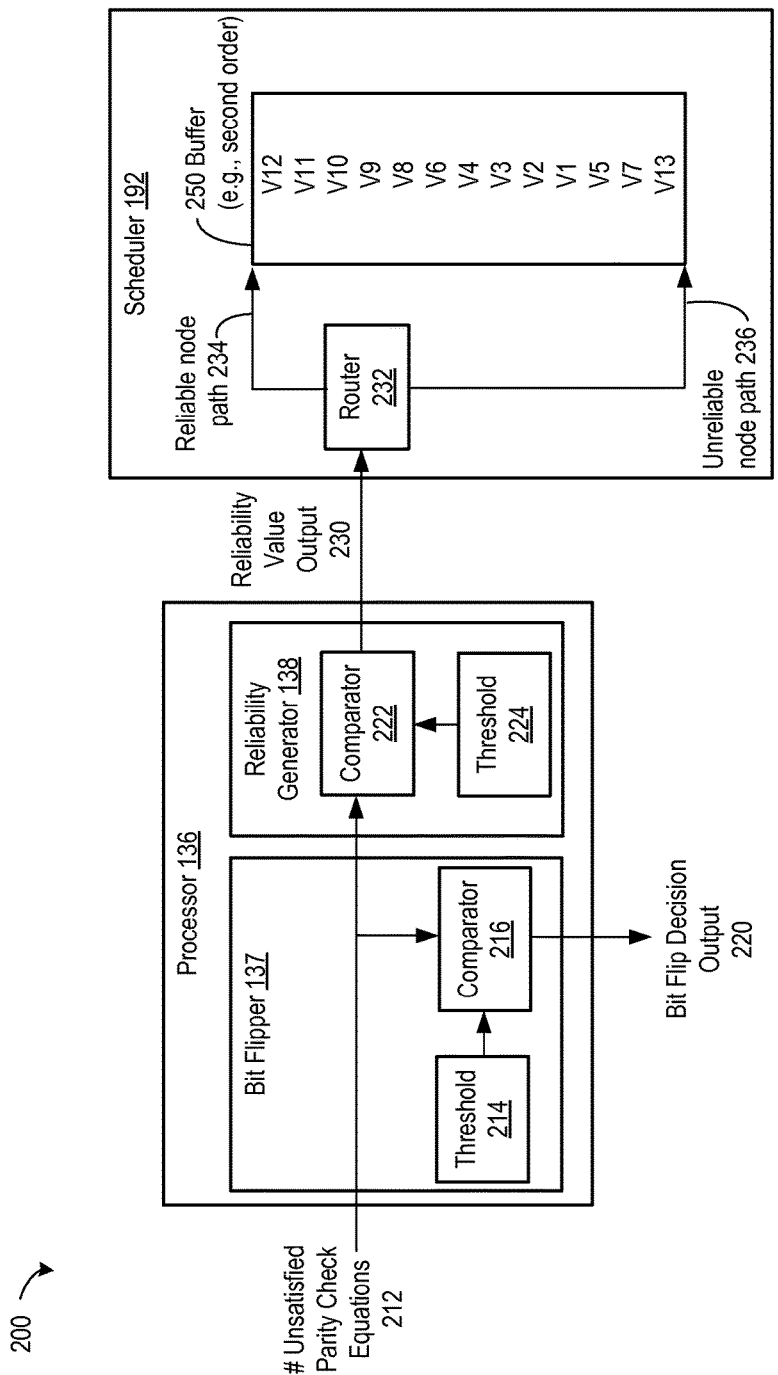
FIG. 2 is a block diagram of a particular illustrative example of components that may be included in the ECC decoder of the data storage device of FIG. 1.

Referring to FIG. 2, an illustrative example of components that may be included in a decoder are depicted and designated 200. For example, the decoder may include or correspond to the decoder 135 of FIG. 1.

The decoder may include the processor 136 and the scheduler 192. The processor 136 includes the bit flipper 137 and the reliability generator 138. The scheduler 192 includes a router 232 and a buffer 250.

The bit flipper 137 may include a first threshold 214 and a first comparator 216. The first comparator 216 may be configured to receive an input 212 that indicates a number of unsatisfied parity check equations corresponding to a particular variable node and the first threshold 214. The first comparator 216 may perform a comparison between the number of unsatisfied parity check equations and the first threshold 214. The first comparator 216 may provide a bit flip decision output 220 based on the comparison. For example, if the number of unsatisfied parity check equations is less than the first threshold 214, the bit flip decision output 220 may indicate not to change a value of a symbol of the particular variable node. Alternatively, if the number of unsatisfied parity check equations is greater than or equal to the first threshold 214, the bit flip decision output 220 may indicate to change the value of the symbol of the particular variable node.

The reliability generator 138 may include a second threshold 224 and a second comparator 222. The second comparator 222 may be configured to receive the input 212 that indicates the number of unsatisfied parity check equations corresponding to a particular variable node and to receive the second threshold 224. The second comparator 222 may perform a comparison between the number of unsatisfied parity check equations and the second threshold 224. The second comparator 222 may provide a reliability value output 230 based on the comparison. For example, if the number of unsatisfied parity check equations is less than the second threshold 224, the reliability value output 230 may indicate that the value of the symbol of the particular variable node is reliable. Alternatively, if the number of unsatisfied parity check equations is greater than or equal to the second threshold 224, the reliability value output 230 may indicate that the value of the symbol of the particular variable node is unreliable. The reliability generator 138 may provide the reliability value output 230 to the scheduler 192.

The router 232 of the scheduler 192 may receive the reliability value output 230. The router 232 may be configured to route an indicator (e.g., a pointer to a memory location that stores a corresponding symbol value) of the particular variable node to the buffer 250 based on the reliability value output 230. For example, the router 232 may route the indicator via a node path 234 for reliable nodes if the reliability value output 230 indicates that the value of the symbol of the particular variable node is reliable. Alternatively, the router 232 may route the indicator via a node path 236 for unreliable nodes if the reliability value output 230 indicates that the value of the symbol of the particular variable node is unreliable.

The buffer 250 may store indicators of a set of variable nodes according to their reliabilities. For example, indicators of the more reliable variable nodes may be stored at one end of the buffer, and indicators of the less reliable variable nodes may be stored at the other end of the buffer. The indicators stored in the buffer 250 may correspond to an order in which the set of variable nodes are to be processed during a decoding iteration. To illustrate, the set of variable nodes may include a set of thirteen variable nodes index as v1-v13 (e.g., indicators v1-v13). The set of variable nodes may have been serially processed during a first decode iteration starting with a variable node v1 and ending with a variable node v13. To illustrate, a first order of processing the set of variable nodes (based on a first order) during a first decode iteration may have been as follows: v1, v2, v3, v4, v5, v6, v7, v8, v9, 10, v11, v12, v13. During processing of the set of variable nodes during the first decode iteration, the variable nodes v5, v7, and v13 may have been identified as unreliable. Based on reliability values for each of the variable nodes v1-v13, the buffer 250 may have been populated to indicate a second order of processing the set of variable nodes during a second decode iteration. The buffer 250 may indicate that the set of variable nodes are to be processed based on the second order during the second decode iteration as follows (starting with the variable node v13): v13, v7, v5, v1, v2, v3, v4, v6, v8, v9, v10, v11, v12. Accordingly, the second order results in one or more nodes determined to be unreliable being processed prior to one or more nodes determined to be reliable.

Although the buffer 250 is described as being a single buffer, in other implementations, the scheduler 192 may include multiple buffers, such as a first buffer to receive one or more indicators associated with reliable variable nodes and a second buffer to receive one or more indicators associated with unreliable nodes. An order of processing a set of variable nodes for a next decode iteration may be determined by selecting the indicators of the second buffer to be executed prior to the indicators of the first buffer.

Thus, the system 200 may be configured to enable a schedule of a next decode iteration to be dynamically generated based on reliability values of variable nodes. The schedule may indicate that one or more nodes determined to be unreliable are processed during the next decode iteration prior to one or more nodes determined to be reliable. By scheduling processing of the set of nodes based on one or more reliability values, a convergence rate of iterative decoding performed by the decoder 135 may be increased.

Figure 3:
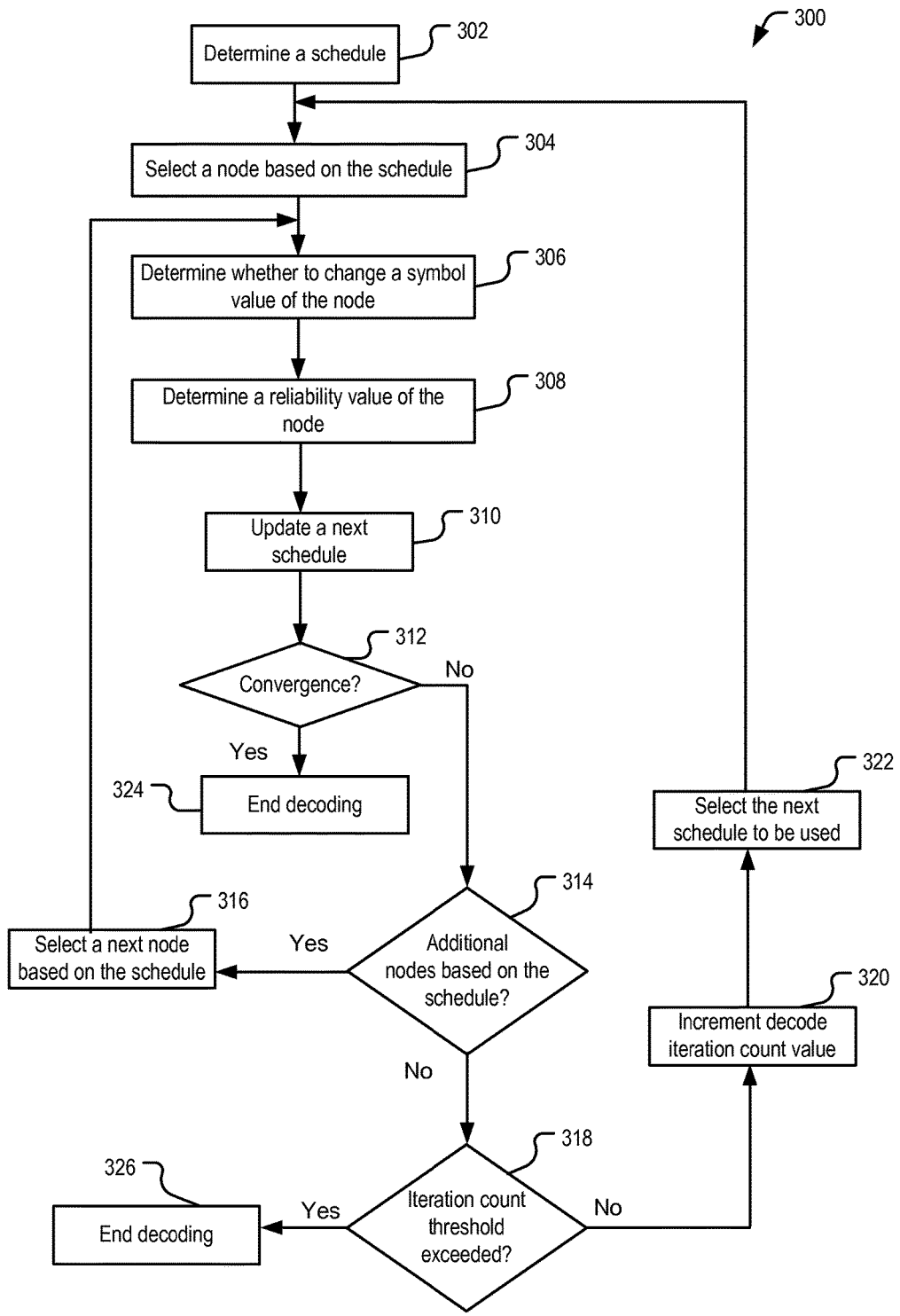
FIG. 3 is a flowchart of a particular illustrative example of a method of decoding that may be performed by the ECC decoder of the data storage device of FIG. 1.

Referring to FIG. 3, a particular illustrative example of a method of a method of decoding is depicted and generally designated 300. The method 300 may be performed at the data storage device 102, such as performed by the controller 130 and/or the access device 160 of FIG. 1, or a combination thereof, as illustrative, non-limiting examples. To illustrate, the method 300 may be performed by the decoder 135 of the ECC engine 134 of FIG. 1.

The method 300 may include determining a schedule, at 302. The schedule may include or correspond to the first schedule 186 of FIG. 1. The method 300 may also include selecting a node (of a set of nodes) based on the schedule, at 304. For example, the node may be selected by the selector 184 of FIG. 1.

The method 300 may further include determining whether to change a symbol value of the node, at 306. A determination to change the symbol value may be made by the processor 136 (e.g., the bit flipper 137) of FIG. 1. The method 300 may include determining a reliability value of the node, at 308. The reliability value may be determined by the processor 136 (e.g., the reliability generator 138) of FIG. 1. A next schedule may be updated at 310. For example, the next schedule may include or correspond to the second schedule 194 of FIG. 1. The next schedule may be updated by adding the node to a position in the next schedule that is based at least in part on the reliability value of the node.

The method 300 may determine whether convergence has occurred, at 312. For example, the convergence detector 196 of FIG. 1 may determine whether convergence has occurred. If convergence has occurred, the method 300 may end decoding at 324. If convergence has not occurred, the method 300 may determine, at 314, whether any additional nodes of the set of nodes are to be processed based on the schedule. If there are one or more nodes to be processed, the method 300 may select a next node based on the schedule, at 316, and then advance to 306. If there are no more nodes to be processed based on the schedule, the method 300 may advance to 318.

At 318, the method 300 may include determining whether an iteration count threshold is exceeded. The iteration count may be maintained by the iteration counter 188 of FIG. 1. If the iteration counter threshold is exceeded, the method 300 may end decoding, at 326. If the iteration count threshold is not exceeded, the method 300 may increment an iteration count value, at 320. After the iteration count value is incremented, the method 300 may include selecting the next schedule to be used, at 322, and may then advance to 304. The method 300 may enable dynamic scheduling of a set of nodes to be processed for a particular decode iteration (e.g., an initial decode iteration or a subsequent decode iteration) based on a reliablity value.

Figure 4:
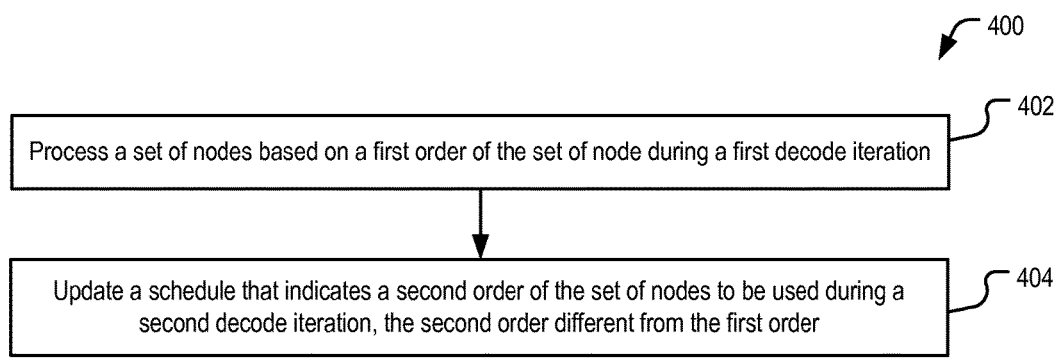
FIG. 4 is a flowchart of another illustrative example of a method of decoding that may be performed by the ECC decoder of the data storage device of FIG. 1.

Referring to FIG. 4, a particular illustrative example of a method of decoding is depicted and generally designated 400. The method 400 may be performed at the data storage device 102, such as by the controller 130 and/or the access device 160 of FIG. 1, or a combination thereof, as illustrative, non-limiting examples. To illustrate, the method 400 may be performed by the decoder 135 of the ECC engine 134 of FIG. 1.

The method 400 includes processing a set of nodes based on a first order of the set of nodes during a first decode iteration, at 402. The set of nodes may be related to a representation of a codeword. The first order may be based on the first schedule 186 of FIG. 1. The method 400 also includes updating a schedule that indicates a second order of the set of nodes to be used during a second decode iteration, the second order different from the first order, at 404. For example, the schedule may include or correspond to the second schedule 194 of FIG. 1. The schedule may be the same as or may be different from a particular schedule used to process the set of nodes during the first decode iteration.

In some implementations, the schedule may be updated (e.g., generated) during processing of the set of nodes during the first decode iteration. For example, the schedule may be updated "on-the-fly" (e.g., in parallel with the set of nodes being processed during the first decode iteration). To illustrate, at least a portion of the schedule may be generated during the first decode iteration. In some implementations, an entirety of the schedule may be generated during the first decode iteration. If the entirety of the schedule is generated during the first decode operation, updating (e.g., generating) the schedule may not use any additional processing cycles (e.g., clock cycles) beyond what is needed to process the set of nodes during the first decode iteration.

The method 400 may enable dynamic scheduling of a set of nodes to be processed for a particular decode iteration (e.g., an initial decode iteration or a subsequent decode iteration) based on a reliablity value. By dynamically scheduling the set of nodes based on one or more reliability values, a convergence rate of iterative decoding performed by the decoder may be increased.

The method 300 of FIG. 3 and/or the method 400 of FIG. 4 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 300 of FIG. 3 and/or the method 400 of FIG. 4 can be initiated or controlled by one or more processors, such as one or more processors included in or coupled to a controller or a memory of the data storage device 102, and/or the access device 160 of FIG. 1. A controller configured to perform the method 300 of FIG. 3 and/or the method 400 of FIG. 4 may be able to dynamically schedule processing of a set of nodes. As an example, one or more of the methods of FIGS. 3-4, individually or in combination, may be performed by the controller 130 of FIG. 1. To illustrate, a portion of one of the methods FIGS. 3-4 may be combined with a second portion of one of the methods of FIGS. 3-4. Additionally, one or more operations described with reference to the FIGS. 3-4 may be optional, may be performed at least partially concurrently, and/or may be performed in a different order than shown or described.

Although various components of the data storage device 102, such as the controller 130 of FIG. 1 are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method 300 of FIG. 3 and/or the method 400 of FIG. 4.

Alternatively or in addition, one or more aspects of the data storage device 102, such as the controller 130 of FIG. 1 may be implemented using a microprocessor or microcontroller programmed (e.g., by executing instructions) to perform operations described herein, such as one or more operations of the method 300 of FIG. 3 and/or one or more operations of the method 400 of FIG. 4, as described further herein. As an illustrative, non-limiting example, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

In some implementations, each of the controller 130, the memory device 103, and/or the access device 160 of FIG. 1 may include a processor executing instructions that are stored at a memory, such as a non-volatile memory of the data storage device 102 or the access device 160 of FIG. 1. Alternatively or additionally, executable instructions that are executed by the processor may be stored at a separate memory location that is not part of the non-volatile memory, such as at a read-only memory (ROM) of the data storage device 102 or the access device 160 of FIG. 1.

The memory 104 and/or the memory 140 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, a phase change memory (PCM) or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 and/or the memory 140 may include another type of memory. The memory 104 and/or the memory die 140 of FIG. 1 may include a semiconductor memory device.

Semiconductor memory devices include volatile memory devices, such as dynamic random access memory ("DRAM") or static random access memory ("SRAM") devices, non-volatile memory devices, such as magneto resistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the examples described herein are intended to provide a general understanding of the various aspects of the disclosure. Other implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed:

1. A decoder comprising: a processor configured to generate information during a first decode iteration that processes a set of nodes, each value of the set of nodes corresponding to a value of a representation of a codeword, the set of nodes processed in a first order; and a scheduler coupled to the processor, the scheduler configured to generate, based on the information and prior to a second decode iteration, a schedule that indicates a second order of the set of nodes, the second order different from the first order; wherein the processor is further configured to determine a number of unsatisfied parity checks for a particular node, and wherein the processor includes: a bit flipper configured to compare the number of unsatisfied parity checks to a first threshold and to change a value corresponding to the particular node if the number is greater than or equal to the first threshold; and a reliability generator configured to generate a reliability value of the particular node based on a comparison of the number of unsatisfied parity checks to a second threshold, the reliability value indicating one of reliable, unreliable, or a degree of reliability.

2. The decoder of claim 1, further comprising:
a memory configured to store the values of the set of nodes; and
a selector coupled to the memory and to the processor, the selector configured to select a particular value from the memory based on the first order and to provide the particular value to the processor, wherein the processor is further configured to process the set of nodes in the second order during a second decode iteration, and wherein the codeword comprises an error correction coding (ECC) codeword.

3. The decoder of claim 1, wherein the values of the set of nodes represent bit values or symbols of the codeword, wherein the processor is further configured to output a reliability value to the scheduler for a particular node of the set of nodes, and wherein the scheduler is further configured to determine a position of the particular node in the second order based on the reliability value.

4. The decoder of claim 1, wherein the set of nodes includes a set of variable nodes, and further comprising:
a symbol generator configured to receive the representation of the codeword from a non-volatile memory and to generate a set of symbols based on the representation, each symbol of the set of symbols representing a value of a different variable node of the set of variable nodes;
a syndrome generator configured to generate a plurality of syndromes based on the set of symbols, each syndrome of the plurality of syndromes representing a value of a different check node of set of check nodes; and
a memory coupled to the symbol generator and to the syndrome generator, the memory configured to store the set of symbols and the plurality of syndromes.

5. The decoder of claim 4, further comprising an iteration counter, the iteration counter configured to count a number of decode iterations performed by the processor to decode the representation of the codeword based on the set of symbols and the plurality of syndromes.

6. The decoder of claim 1, further comprising:
a memory coupled to the processor and configured to store each of the values of the set of nodes as a symbol value, a syndrome value, or a reliability value; and
a convergence detector coupled to the processor, the convergence detector configured to determine if convergence has occurred during the first decode iteration.

7. A device comprising: a non-volatile memory configured to store a representation of a codeword; and a controller coupled to the non-volatile memory, the controller including an error correction coding (ECC) decoder configured to generate information during a first decode iteration that processes each node of a set of nodes based on a first order, each value of the set of nodes corresponding to a value of the representation of the codeword, wherein the ECC decoder is further configured to, during a second decode iteration, process at least one node of the set of nodes in a second order, the second order based on the information and different from the first order; wherein the controller is further configured to determine a number of unsatisfied parity checks for a particular node, and wherein the controller includes: a bit to change a value corresponding to the particular node if the number is greater than or equal the particular node based on a comparison of the number of unsatisfied parity checks to a second threshold, the reliability value indicating one of reliable, unreliable, or a degree of reliability.

8. The device of claim 7, wherein the ECC decoder is further configured to, during the first decode iteration:
sequentially process each individual node of the set of nodes once according to the first order; and
generate at least a portion of a schedule that indicates the second order.

9. The device of claim 7, wherein the set of nodes includes multiple groups of nodes, wherein the ECC decoder is further configured to sequentially process each group of nodes according to the first order during the first decode iteration, and wherein the at least one node comprises at least one group of nodes.

10. An apparatus comprising: means for storing data; and means for processing information, the means for processing information coupled to the means for storing data and configured to generate information during a first decode operation that processes nodes, each value of the nodes corresponding to a value of a representation of a codeword, the nodes processed in a first order, and to generate, based on the information and prior to a second decode operation, a schedule indicative of a second order of the nodes that differs from the first order; and means for determining a number of unsatisfied parity checks for a particular node, and including: means for comparing the number of unsatisfied parity checks to a first threshold and for changing a value corresponding to the particular node if the number is greater than or equal to the first threshold; and means for generating a reliability value of the particular node based on a comparison of the number of unsatisfied parity checks to a second threshold, the reliability value indicating one of reliable, unreliable, or a degree of reliability.

11. A method comprising: generating information based on processing a set of nodes in a first order during a first decode iteration, each value of the set of nodes corresponding to a value of a representation of a codeword; and updating a schedule that indicates a second order to process the set of nodes, the second order based on the information and different from the first order; and determining a number of unsatisfied parity checks for a particular node, and including: comparing the number of unsatisfied parity checks to a first threshold and for changing a value corresponding to the particular node if the number is greater than or equal to the first threshold; and generating a reliability value of the particular node based on a comparison of the number of unsatisfied parity checks to a second threshold, the reliability value indicating one of reliable, unreliable, or a degree of reliability.

12. The method of claim 11, further comprising:
receiving the representation of the codeword stored at a non-volatile memory;
generating a set of symbols based on the representation; and
generating a plurality of syndromes based on the set of symbols.

13. The method of claim 12, wherein the first decode iteration is an initial decode iteration to decode the representation of the codeword, and further comprising:
receiving, from the non-volatile memory, a set of log-likelihood ratios (LLRs) corresponding to the set of nodes;

determining a set of reliability values based on the set of LLRs, each reliability value corresponding to a different node of the set of nodes; and determining the first order based on the set of reliability values.

14. The method of claim 11, wherein processing the set of nodes in the first order comprises:

selecting, based on the first order, a particular node of the set of nodes;

determining a number of satisfied parity checks associated with the particular node; and determining whether to change a value of a particular symbol corresponding to the particular node based on a comparison of the number of satisfied parity checks to a first threshold.

15. The method of claim 14, further comprising:

determining a reliability value corresponding to the particular node based on a second comparison of:

the number of satisfied parity checks to a second threshold; or a log-likelihood ratio of the particular node to a third threshold; and determining the second order based at least in part on the reliability value.

16. The method of claim 14, further comprising determining a reliability value corresponding to the particular node based on a second comparison of a log-likelihood ratio of the particular node to a third threshold.

17. The method of claim 11, wherein the set of nodes includes variable nodes that represent bit values or symbols of the codeword.

18. The method of claim 11, wherein the set of nodes includes multiple groups of nodes, wherein the first order indicates a processing order of the multiple groups of nodes, and wherein processing the set of nodes in the first order comprises:

selecting, based on the first order, a group of nodes of the set of nodes;

for each node included in the group of nodes, determining a number of satisfied parity checks associated with the node;

identifying a particular node of the group of nodes having a lowest number of satisfied parity checks;

determining a reliability value corresponding to the group of nodes based on a comparison of a number of satisfied parity checks of the particular node to a threshold; and determining the second order based at least in part on the reliability value.

19. The method of claim 11, further comprising:

receiving a set of log-likelihood ratios (LLRs) corresponding to the set of nodes; and determining, during the first decode iteration, a reliability value of a particular node of the set of nodes based on a number of unsatisfied parity checks associated with the particular node, an indication that a value corresponding to the particular node was changed in a previous decode iteration, an LLR value corresponding to the particular node, a result of a soft exclusive OR performed on the set of LLRs, or a combination thereof.

20. The method of claim 11, further comprising:

processing the set of nodes according to the second order during a second decode iteration, wherein the second order indicates that one or more nodes of the set of nodes having a low reliability value are to be processed during the second decode iteration prior to one or more nodes of the set of nodes having a high reliability value being processed during the second decode iteration; and generating a second schedule that indicates a third order of the set of nodes to be used during a third decode iteration, the third decode iteration subsequent to the second decode iteration.

21. The method of claim 20, wherein the third order is the same as the second order.

22. The device of claim 8, wherein the ECC decoder is further configured to generate an entirety of the schedule during the first decode iteration.

23. The method of claim 14, wherein a value of the first threshold varies from clock cycle to clock cycle, from node to node, or from decode iteration to decode iteration.

24. The method of claim 14, further comprising determining a value of the first threshold based on a reliability of the particular symbol, based on a determination of whether the value of the particular symbol was previously indicated as unreliable, or a combination thereof.

25. The method of claim 15, wherein the reliability value indicates one of reliable or unreliable.

26. The method of claim 15, wherein the reliability value indicates a degree of reliability.

27. The decoder of claim 1, wherein the processor is further configured to decode data based on the second order during the second decode iteration to reduce a number of iterations as compared to decoding the data based on the first order.

* * * * *